United States Patent
Akaike et al.

(10) Patent No.: US 9,885,747 B2
(45) Date of Patent: Feb. 6, 2018

(54) SUBSTRATE INSPECTION APPARATUS AND SUBSTRATE TEMPERATURE CONTROL METHOD

(71) Applicant: Tokyo Electron Limited, Tokyo (JP)

(72) Inventors: Yutaka Akaike, Yamanashi (JP); Dai Kobayashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 136 days.

(21) Appl. No.: 14/779,856

(22) PCT Filed: Mar. 18, 2014

(86) PCT No.: PCT/JP2014/058153
§ 371 (c)(1),
(2) Date: Sep. 24, 2015

(87) PCT Pub. No.: WO2014/157123
PCT Pub. Date: Oct. 2, 2014

(65) Prior Publication Data
US 2016/0109508 A1    Apr. 21, 2016

(30) Foreign Application Priority Data

Mar. 25, 2013  (JP) .................................. 2013-062141
Sep. 27, 2013  (JP) .................................. 2013-201289

(51) Int. Cl.
*G01R 15/18*    (2006.01)
*G01R 27/08*    (2006.01)
(Continued)

(52) U.S. Cl.
CPC ........... *G01R 31/2874* (2013.01); *G01R 1/04* (2013.01); *G01R 31/2601* (2013.01); *H01L 21/67109* (2013.01)

(58) Field of Classification Search
CPC .. G01R 31/2874; G01R 31/2601; G01R 1/04; H01L 21/67109
(Continued)

(56) References Cited

U.S. PATENT DOCUMENTS 5,585,738 A    12/1996  Kuji et al.
5,640,101 A     6/1997  Kuji et al.
(Continued)

FOREIGN PATENT DOCUMENTS

EP      0240780 A2    10/1987
JP    H07-271452 A    10/1995
(Continued)

OTHER PUBLICATIONS

International Search Report dated May 27, 2014 in PCT Application No. PCT/JP2014/058153.

*Primary Examiner* — Farhana Hoque

(57) ABSTRACT

A substrate inspection apparatus includes a mounting table, an inspection unit, a temperature control unit and a medium channel. The mounting table mounts thereon a substrate on which a semiconductor device is formed. The inspection unit inspects electrical characteristics of the semiconductor device on the mounted substrate. The temperature control unit controls a temperature of the mounting table. The medium channel passes through the mounting table. The temperature control unit includes a high-temperature medium supply unit supplies a high-temperature medium to the medium channel, a low-temperature medium supply unit supplies a low-temperature medium to the medium channel and a medium mixing unit mixes the high-temperature medium and the low-temperature medium which are supplied to the medium channel.

13 Claims, 9 Drawing Sheets

(51) Int. Cl.
  *G01R 31/28* (2006.01)
  *H01L 21/67* (2006.01)
  *G01R 1/04* (2006.01)
  *G01R 31/26* (2014.01)

(58) Field of Classification Search
  USPC .................................. 324/127, 750.03, 693
  See application file for complete search history.

(56) References Cited

U.S. PATENT DOCUMENTS

| | | | |
|---|---|---|---|
| 2009/0118872 A1 | 5/2009 | Nonaka et al. | |
| 2011/0083837 A1 | 4/2011 | Sasaki et al. | |
| 2012/0234528 A1 | 9/2012 | Hatta | |
| 2012/0262197 A1* | 10/2012 | Bernstein | H01L 21/76898 |
| | | | 324/750.3 |

FOREIGN PATENT DOCUMENTS

| | | | | |
|---|---|---|---|---|
| JP | 1995297242 A | 11/1995 | | |
| JP | H07297242 A | 11/1995 | | |
| JP | 2001-134324 A | 5/2001 | | |
| JP | 2004-003753 | * | 1/2004 | ................ F25B 1/00 |
| JP | 2004003753 A | 1/2004 | | |
| JP | 2012-142387 | * | 7/2012 | |
| JP | 2012142387 A | 7/2012 | | |
| JP | 20121993341 A | 10/2012 | | |
| KR | 10-2012-0106927 A | 9/2012 | | |

\* cited by examiner

SUBSTRATE INSPECTION APPARATUS AND SUBSTRATE TEMPERATURE CONTROL METHOD

CROSS REFERENCE

This application is a National Stage Application of, and claims priority to, PCT Application No. PCT/JP2014/058153, filed on Mar. 18, 2014, entitled "SUBSTRATE INSPECTION APPARATUS AND SUBSTRATE TEMPERATURE CONTROL METHOD," which claims priority to Japanese Patent Application No. 2013-062141, filed on Mar. 25, 2013, and to Japanese Patent Application No. 2013-201289, filed on Sep. 27, 2013. The foregoing patent applications are herein incorporated by reference by entirety for all purposes.

FIELD OF THE INVENTION

The disclosure relates to a substrate inspection apparatus for inspecting a substrate mounted on a mounting table and a substrate temperature control method.

BACKGROUND OF THE INVENTION

A prober is known as a device for inspecting electrical characteristics of a semiconductor device, e.g., a power device or a memory, formed on a semiconductor wafer (hereinafter, referred to as "wafer") as a substrate. The prober includes a probe card having a plurality of probe needles and a vertically movable stage on which a wafer is mounted. Electrical characteristics of the semiconductor device are inspected by bringing probe needles of a probe card into contact with solder bumps or electrode pads of the semiconductor device and allowing an inspection current to flow from the probe needles to the electrode pads or the solder bumps. The prober has a test head for determining a quality of the semiconductor device based on the inspection result of the electrical characteristics of the semiconductor device by the probe card (see, e.g., Patent Document 1).

A semiconductor device for vehicle mounting is used under a severe environment and, thus, an operation of the semiconductor device needs to be ensured under the severe environment. Accordingly, the prober may inspect electrical characteristics of the semiconductor device under a high-temperature environment where the wafer is heated. When an inspection current is made to flow through an inspection circuit of a power device or made to simultaneously flow through inspection circuits of a plurality of memories formed on a wafer, the amount of heat generated from the wafer is increased. Therefore, the electrical characteristics of the semiconductor device may be inspected while cooling the wafer.

To do so, in a conventional prober, a stage 70 has therein a heater 71 and a medium channel 72 passes through the stage 70, as shown in FIG. 9. A low-temperature medium is supplied from a chiller 73 to the medium channel 72. By controlling ON/OFF of the heater 71 or the amount of the low-temperature medium supplied to the medium channel 72, a wafer W mounted on the stage 70 is heated or cooled.

Patent Document 1: Japanese Patent Application Publication No. H7-297242

However, the prober shown in FIG. 9 is disadvantageous in that when the chiller 73 supplies a medium having a low temperature, e.g., about −30° C., to the medium channel 72 in order to cool the wafer W whose temperature has been increased to a high temperature, e.g., about 95° C., by the flow of the inspection current to the inspection circuit of the power device, hunting of the temperature of the stage 70 occurs due to a difference between a desired temperature and the temperature of the low-temperature medium and, thus, it is difficult to maintain the wafer W at the desired temperature.

In order to suppress the hunting of the temperature of the stage 70, it is attempted to supply a medium having a comparatively high-temperature, e.g., about 75° C., to the medium channel. Since, however, it is general that the chiller 73 does not change the temperature of the supplied medium, the temperature of the wafer W may become close to the desired temperature depending on a heat transfer condition between the wafer W and the stage 70 but cannot reach the desired temperature.

In other words, in the prober, it is difficult to control the temperature of the wafer W to a desired level when electrical characteristics of the power device or the memory of the wafer W.

SUMMARY OF THE INVENTION

In view of the above, the disclosure provides a substrate inspection apparatus and a substrate temperature control method which can control a temperature of a substrate to a desired level.

In accordance with an aspect of the present invention, a substrate inspection apparatus comprising a mounting table configured to mount thereon a substrate on which a semiconductor device is formed; an inspection unit configured to inspect electrical characteristics of the semiconductor device on the mounted substrate; a temperature control unit configured to control a temperature of the mounting table; and a medium channel passing through the mounting table. The temperature control unit includes a high-temperature medium supply unit configured to supply a high-temperature medium to the medium channel; a low-temperature medium supply unit configured to supply a low-temperature medium to the medium channel; and a medium mixing unit configured to mix the high-temperature medium and the low-temperature medium which are supplied to the medium channel.

In one embodiment, the medium mixing unit includes: a first control valve configured to control a flow rate of the high-temperature medium; and a second control valve configured to control a flow rate of the low-temperature medium. The medium channel and the medium mixing unit are connected to each other such that, before the high-temperature medium and the low-temperature medium are mixed with each other, the first control valve controls the flow rate of the high-temperature medium and the second control valve controls the flow rate of the low-temperature medium.

In one embodiment, the substrate inspection apparatus further comprises a circulation channel branched at a branch point at a downstream side of the medium channel passing through the mounting table. The circulation channel is connected to the medium channel at a junction between the medium mixing unit and the mounting table. The circulation channel has a pump configured to forcibly transferring the mixture of the high-temperature medium and the low-temperature medium from the branch point to the junction.

In one embodiment, the substrate is a circular plate-shaped semiconductor wafer and has a diameter of 300 mm or above.

In one embodiment, the high-temperature medium has a temperature ranging from 20° C. to 180° C. and the low-temperature medium has a temperature ranging from −100° C. to 60° C.

In one embodiment, the substrate inspection further includes a temperature sensor for measuring a temperature of the mixture of the high-temperature medium and the low-temperature medium inside the medium channel between the medium mixing unit and the mounting table.

In one embodiment, the substrate inspection further includes a temperature sensor for measuring temperature of the mounting table.

In one embodiment, the substrate inspection further includes one or both of a heater and a peltier element provided at the mounting table.

In accordance with another aspect of the present invention, a substrate temperature control method in a substrate inspection apparatus, the substrate inspection apparatus including: a mounting table configured to mount thereon a substrate on which a semiconductor device is formed; an inspection unit configured to inspect electrical characteristics of the semiconductor device formed on the mounted substrate; a temperature control unit configured to control a temperature of the mounting table; and a medium channel passing through the mounting table, wherein the temperature control unit includes a high-temperature medium supply unit configured to supply a high-temperature medium to the medium channel and a low-temperature medium supply unit configured to supply a low-temperature medium to the medium channel, and the method including mixing the high-temperature medium and the low-temperature medium and supplying the mixture of the high-temperature medium and the low-temperature medium to the medium channel.

In one embodiment, the method further includes, before the high-temperature medium and the low-temperature medium are mixed with each other, controlling a flow rate of the high-temperature medium and a flow rate of the low-temperature medium.

In one embodiment, the substrate inspection apparatus further comprises a circulation channel branched at a branch point at a downstream side of the medium channel passing through the mounting table. The circulation channel is connected to the medium channel at a junction between the medium mixing unit and the mounting table. The method further includes circulating the mixture of the high-temperature medium and the low-temperature medium through the medium channel between the junction and the branch point and through the circulation channel.

In one embodiment, the temperature control unit further includes a heater provided at the mounting table. The method further includes increasing a maximum temperature of a temperature control range of the mounting table by operating the heater.

In one embodiment, the temperature control unit further includes a peltier element provided at the mounting table. The method further includes increasing a maximum temperature of a temperature control range of the mounting table by operating the peltier element as a heating element and decreasing a minimum temperature of the temperature control range of the mounting table by operating the peltier element as a cooling element.

Effect of the Invention

In this disclosure, the high-temperature medium and the low-temperature medium are mixed with each other and supplied to the medium channel passing through the mounting table, so that the temperature of the medium flowing through the medium channel can be controlled and, further, the temperature of the substrate mounted on the mounting table can be controlled by the medium having the controlled temperature. As a result, the temperature of the substrate can be controlled to a desired level.

DETAILED DESCRIPTION OF THE EMBODIMENTS

Hereinafter, embodiments will be described with reference to the accompanying drawings.

First, the substrate inspection apparatus and the substrate temperature control method according to a first embodiment will be described.

Figure 1:
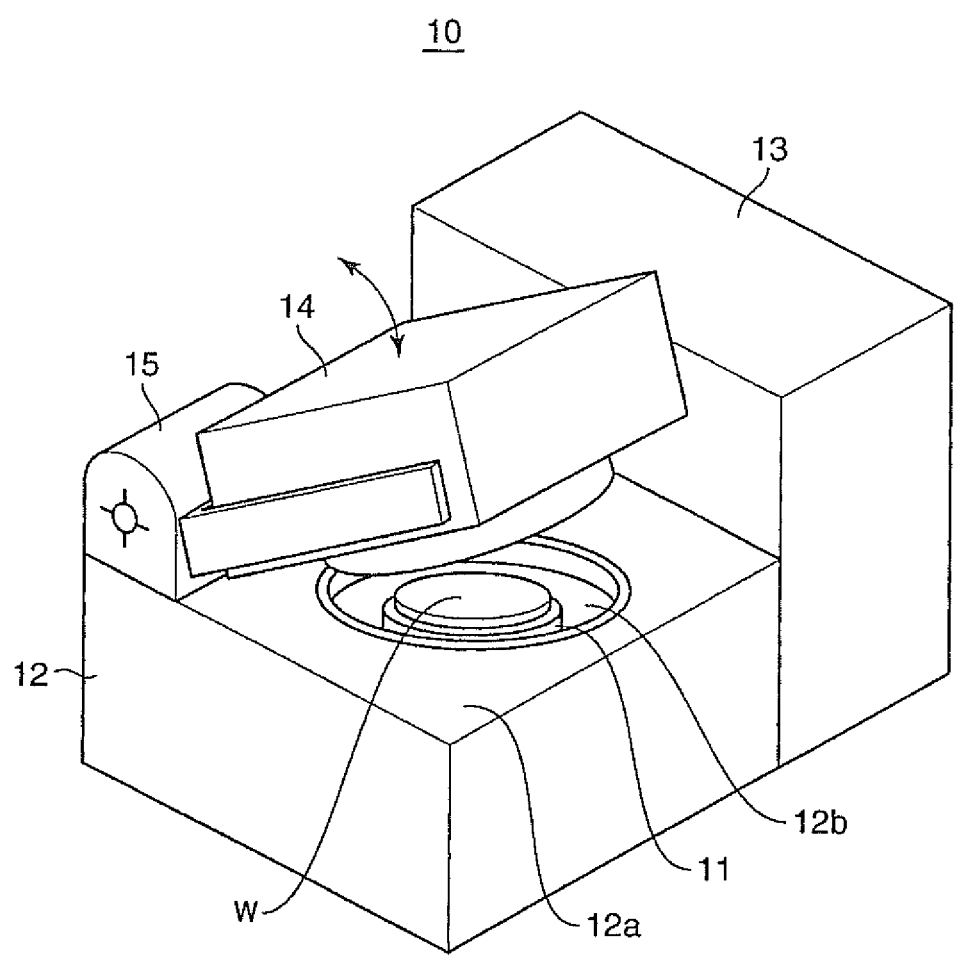
FIG. 1 is a perspective view showing a schematic configuration of a prober as a substrate inspection apparatus according to a first embodiment.

FIG. 1 is a perspective view showing a schematic configuration of a prober 10 as a substrate inspection apparatus according to a first embodiment.

As shown in FIG. 1, the prober 10 includes: a main body 12 having therein a stage 11 (substrate mounting table) for mounting thereon a wafer W, a loader 13 provided close to the main body 12, and a test head 14 (inspection unit) provided to cover the main body 12. The prober 10 inspects electrical characteristics of a semiconductor device formed on a circular plate-shaped wafer having a large aperture, e.g., a diameter of about 300 mm or 450 mm.

The main body 12 is formed in a case shape having a hollow inner space. Formed at a ceiling portion 12a of the main body 12 is an opening 12b that opens above the wafer W mounted on the stage 11. A probe card 17 (see FIG. 2) to be described later is attached to the opening 12b. The probe card 17 faces the wafer W. The wafer W is electrostatically adsorbed on the stage 11 such that a relative position thereof with respect to the stage 11 is not deviated.

The test head 14 has a rectangular parallelepiped shape and is configured to be rotatable upward by a hinge mechanism 15 provided on the main body 12. When the main body 12 is covered by the test head 14, the test head 14 is electrically connected to the probe card 17 via a contact ring (not shown). Further, the test head 14 includes a data storage unit (not shown) for storing, as a measurement data, an electrical signal indicating electrical characteristics of a semiconductor device which is transmitted from the probe card 17, or a determination unit (not shown) for determining whether or not the semiconductor device on the wafer W as an inspection target have electrical defects based on the measurement data.

The loader 13 allows the wafer W on which the semiconductor device is formed to be unloaded from a MAC or a FOUP (not shown) as a transfer container of the wafer W and mounted on the stage 11 of the main body 12 and also allows the wafer W that has been subjected to the inspection of electrical characteristics of the semiconductor device to be unloaded from the stage 11 and accommodated in the FOUP or the MAC.

A plurality of probe needles (not shown) is arranged on a bottom surface of the probe card 17 to correspond to solder bumps or electrode pads of the semiconductor device of the wafer W. The stage 11 allows the electrode pads or the like of the semiconductor device to be in contact with the probe needles by controlling relative positions of the probe card 17 and the wafer W.

When the electrode pads or the like of the semiconductor device are brought into contact with the probe needles, the test head 14 allows an inspection current to flow to the semiconductor device via the probe needles of the probe card 17 and then transmits the electrical signal indicating the electrical characteristics of the semiconductor device to the data storage unit of the test head 14. The data storage unit of the test head 14 stores the transmitted electrical signal as the measurement data. The determination unit determines whether or not the semiconductor device as inspection targets have electrical defects based on the stored measurement data.

Figure 2:
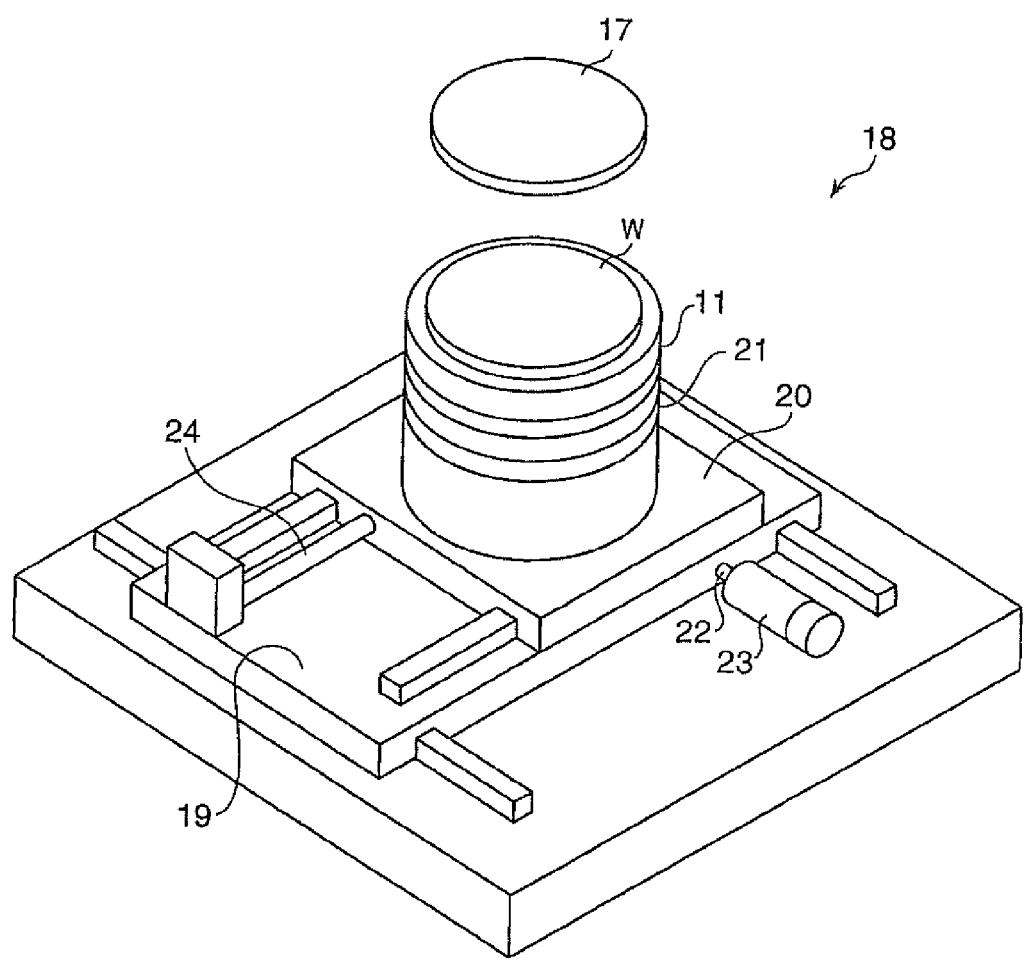
FIG. 2 is a perspective view showing a schematic configuration of a moving unit for a stage of the prober shown in FIG. 1.

FIG. 2 is a perspective view showing a schematic configuration of a moving unit for the stage 11 of the prober 10 shown in FIG. 1. As shown in FIG. 2, the moving unit 18 for the stage 11 includes a Y stage 19 moving along the Y direction in FIG. 2, an X stage 20 moving along the X direction in FIG. 2, and a Z moving unit 21 moving along the Z direction in FIG. 2.

The Y stage 19 is driven with high accuracy in the Y direction by rotation of a ball screw 22 provided along the Y direction. The ball screw 22 is rotated by a Y stage motor 23 that is a step motor. The X stage 20 is driven with high accuracy in the X direction by rotation of a ball screw 24 provided along the X direction. The ball screw 24 is rotated by an X stage motor (not shown) that is a step motor. The stage 11 is movable on the Z moving unit 21 along a θ direction in FIG. 2. The wafer W is mounted on the stage 11.

In the moving unit 18, the semiconductor device formed on the wafer W is made to face the probe card 17 by cooperation of the Y stage 19, the X stage 20, the Z moving unit 21 and the stage 11. Then, the electrode pads or the like of the semiconductor device are brought into contact with the probe needles.

In the case of inspecting the electrical characteristics of the semiconductor device, it is required to heat the wafer W in order to ensure an operation under its use environment. Since, however, the semiconductor device generates heat, the wafer W needs to be cooled. Therefore, in the present embodiment, the prober 10 is provided with a temperature control system 25 for heating and cooling the stage 11 on which the wafer W is electrostatically adsorbed. The temperature control system 25 can heat or cool the wafer W via the stage 11.

Figure 3:
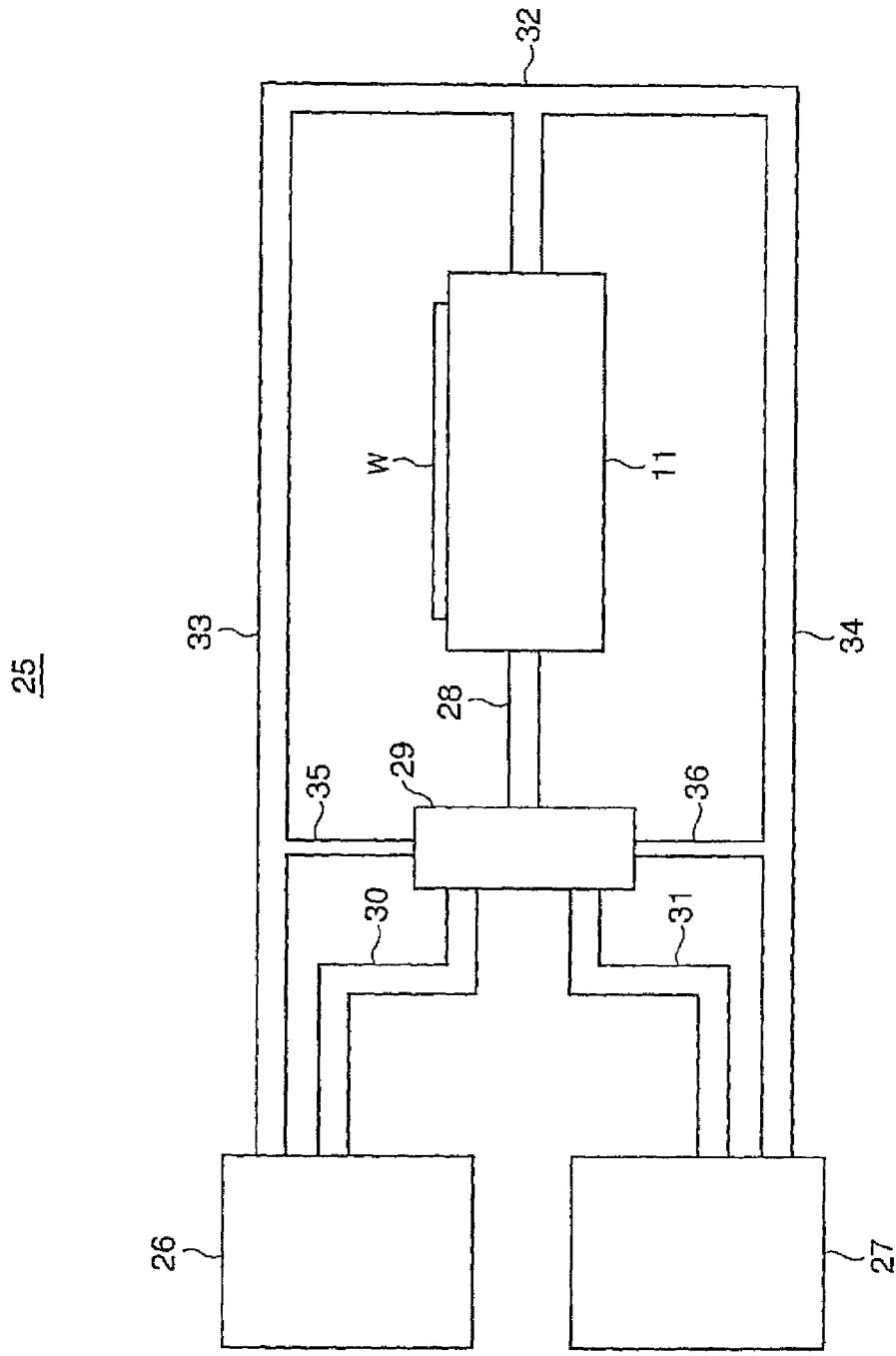
FIG. 3 is a block diagram showing a schematic configuration of a temperature control system of the prober shown in FIG. 1.
Figure 4:
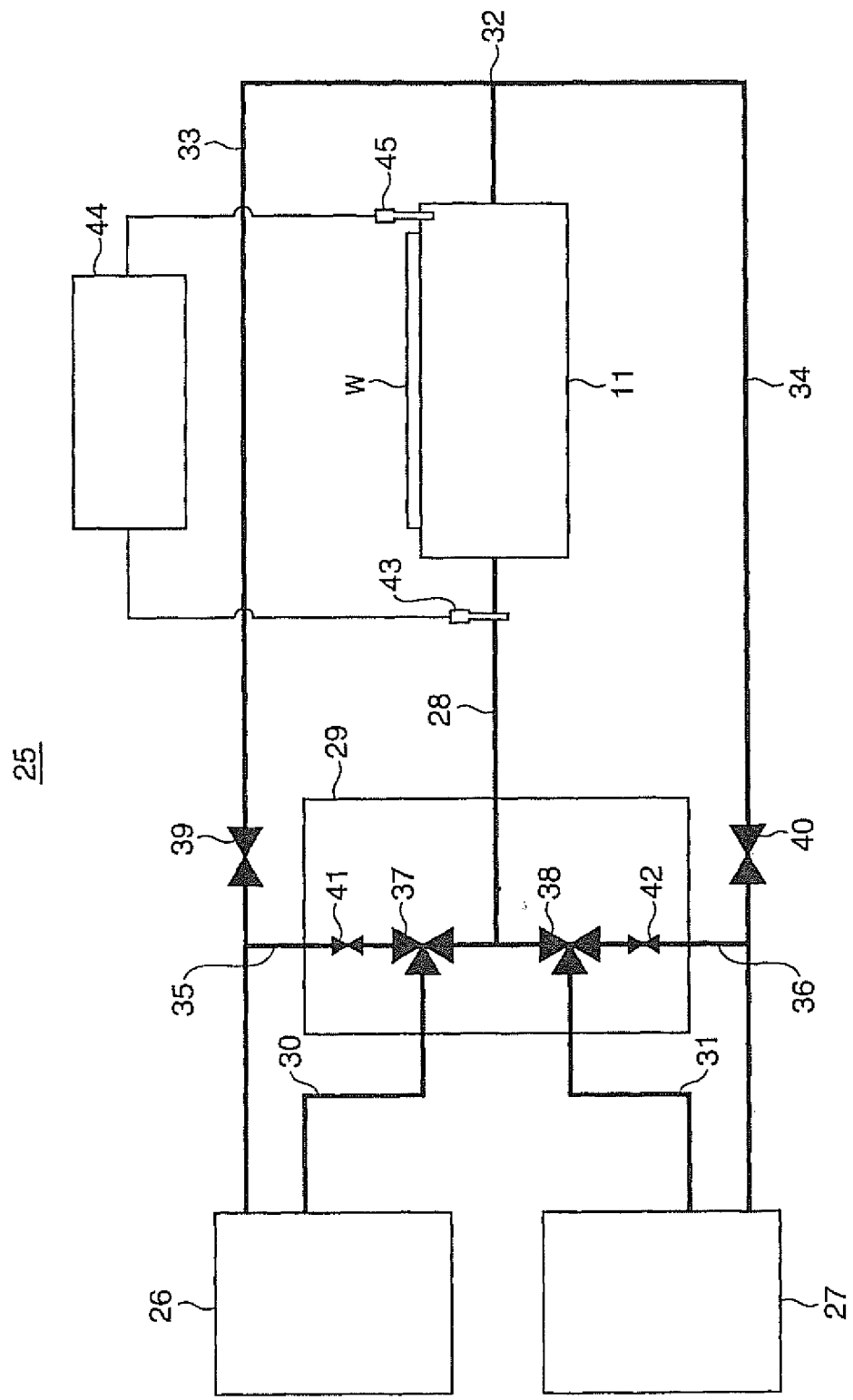
FIG. 4 is a piping diagram showing arrangement of valves in the temperature control system shown in FIG. 3.

FIG. 3 is a block diagram showing a schematic configuration of the temperature control system 25 of the prober 10 shown in FIG. 1. FIG. 4 is a piping diagram showing arrangement of valves in the temperature control system 25 shown in FIG. 3.

As shown in FIG. 3, the temperature control system 25 includes: a high-temperature chiller 26 (high-temperature medium supply unit) configured to supply a medium having a high temperature of, e.g., 20° C. to 180° C.; a low-temperature chiller 27 (low-temperature medium supply unit) configured to supply a medium having a low temperature of, e.g., about −100° C. to 60° C.; a temperature control channel 28 (medium channel) passing through the stage 11; a mixing valve unit (medium mixing unit) provided between the temperature control channel 28, the high-temperature chiller 26 and the low-temperature chiller 27; a high-temperature medium supply line 30 for connecting the high-temperature chiller 26 and the mixing valve unit 29; and a low-temperature medium supply line 31 for connecting the low-temperature chiller 27 and the mixing valve unit 29. The high-temperature medium and the low-temperature medium respectively supplied by the high-temperature chiller 26 and the low-temperature chiller 27 are the same type of medium, e.g., pure water, Galden (Registered Trademark), Fluorinert (Registered Trademark), or the like.

In the temperature control system 25, the high-temperature medium supplied by the high-temperature chiller reaches the mixing valve unit 29 through the high-temperature medium supply line 30, and the low-temperature medium supplied by the low-temperature chiller 27 reaches the mixing valve unit 29 through the low-temperature medium supply line 31. The high-temperature medium and the low-temperature medium are mixed by the mixing valve unit 29. The mixture of the high-temperature medium and the low-temperature medium (hereinafter, simply referred to as "mixed medium") flows through the temperature control channel 28. The mixed medium supplies heat to the stage 11 or absorbs heat from stage 11. Accordingly, mixed medium controls a temperature of the wafer W by controlling a temperature of the stage 11.

The temperature control channel 28 is branched, at a first branch point 32 disposed at a downstream side of the temperature control channel 28 passing through the stage 11, into a first return channel 33 and a second return channel 34. The first return channel 33 is connected to the high-temperature chiller 26 and the second return channel 34 is connected to the low-temperature chiller 27. Therefore, the mixed medium that has controlled the temperature of the stage 11 returns to both of the high-temperature chiller 26 and the low-temperature chiller 27. The mixing valve unit 29 and the first return channel 33 are connected by the high-temperature medium return channel 35. The mixing valve unit 29 and the second return channel 34 are connected by the low-temperature medium return channel 36.

As shown in FIG. 4, the mixing valve unit 29 includes a high-temperature medium dividing valve 37 (first control valve) and a low-temperature medium dividing valve 38 (second control valve). The high-temperature medium dividing valve 37 is disposed between the high-temperature medium supply line 30, the temperature control channel 28 and the high-temperature medium return channel 35. The low-temperature medium dividing valve 38 (second control valve) is disposed between the low-temperature medium supply line 31, the temperature control channel 28 and the low-temperature medium return channel 36.

The high-temperature medium dividing valve 37 divides the high-temperature medium supplied through the high-temperature medium supply line 30 into the temperature control channel 28 and the high-temperature medium return channel 35. Further, the high-temperature medium dividing valve 37 controls the amount of the high-temperature medium divided to the temperature control channel 28 and the amount of the high-temperature medium divided to the high-temperature medium return channel 35. The low-temperature medium dividing valve 38 divides the low-temperature medium supplied through the low-temperature medium supply line 31 into the temperature control channel 28 and the low-temperature medium return channel 36. Further, the low-temperature medium dividing valve 38 controls the amount of the low-temperature medium divided to the temperature control channel 28 and the amount of the low-temperature medium divided to the low-temperature medium return channel 36.

The high-temperature medium of which the divided amount is controlled by the high-temperature medium dividing valve 37 and the low-temperature medium of which the divided amount is controlled by the low-temperature medium dividing valve 38 join at the downstream side of the high-temperature medium dividing valve 37 and at the downstream side of the low-temperature medium dividing valve 38 to be mixed with each other. At this time, the temperature of the mixed medium is determined by the divided amount of the high-temperature medium and that of the low-temperature medium. Therefore, in the temperature control system 25, the temperature of the mixed medium can be controlled by controlling the divided amount of the high-temperature medium and that of the low-temperature medium. For example, when the mixed medium needs to have a high temperature, the divided amount of the high-temperature medium is increased and the divided amount of the low-temperature medium is decreased. On the other hand, when the mixed medium needs to have a low-temperature, the divided amount of the low-temperature medium is increased and the divided amount of the high-temperature medium is decreased.

The high-temperature medium dividing valve 37 and the low-temperature medium dividing valve 38 can set the amount of the high-temperature medium divided into the temperature control channel 28 and the amount of the low-temperature medium divided into the temperature control channel 28 as zero, respectively. Accordingly, the temperature control range of the mixed medium can be extended.

The first mixed medium control valve 39 is disposed in the first return channel 33. The second mixed medium control valve 40 is disposed in the second return channel 34. By closing the first mixed medium control valve 39, the mixed medium that has supplied heat to the stage 11 or has absorbed the heat of the stage 11 (hereinafter, referred to as "mixed medium after temperature control of the stage 11") is prevented from returning to the high-temperature chiller 26. By closing the second mixed medium control valve 40, the mixed medium after temperature control of the stage 11 is prevented from returning the low-temperature chiller 27.

The high-temperature medium control valve 41 is disposed in the high-temperature medium return channel 35. By closing the high-temperature medium control valve 41, the mixed medium after temperature control of the stage 11 which flows through the first return channel 33 is prevented from flowing toward the mixing valve unit 29. The low-temperature medium control valve 42 is disposed in the low-temperature medium return channel 36. By closing the low-temperature medium control valve 42, the mixed medium after temperature control of the stage 11 which flows through the second return channel 34 is prevented from flowing toward the mixing valve unit 29.

A temperature sensor 43 is disposed in the temperature control channel 28 between the mixing valve unit 29 and the stage 11. The temperature sensor 43 measures a temperature of the mixed medium. Further, the temperature sensor 43 is connected to a controller 44. The controller 44 controls the operation of the high-temperature medium dividing valve 37 or the low-temperature medium dividing valve 38 based on the measured temperature of the mixed medium and also controls the temperature of the mixed medium by controlling the divided amount of the high-temperature medium and that of the low-temperature medium. Moreover, the controller 44 controls an operation of other valve(s) other than the high-temperature medium dividing valve 37 or the low-temperature medium dividing valve 38, e.g., an operation of the first mixed medium control valve 39 or the second mixed medium control valve 40.

The controller 44 is connected to a temperature sensor 45 provided at the stage 11. The controller 44 may control the temperature of the mixed medium based on the temperature of the stage 11 which has been measured by the temperature sensor 45. Or, the controller 44 may be connected to a temperature sensor (not shown) measuring a temperature of a semiconductor device formed on the wafer W and control the temperature of the mixed medium based on the temperature of the semiconductor device which has been measured by the temperature sensor.

In the prober 10 as the substrate inspection apparatus of the present embodiment, the high-temperature medium and the low-temperature medium which are supplied to the temperature control channel 28 passing through the stage 11 are mixed with each other and, thus, the temperature of the mixed medium flowing through the temperature control channel 28 can be controlled and, further, the temperature of the wafer W mounted on the stage 11 can be controlled by the mixed medium having a controlled temperature via the stage 11. As a result, the temperature of the wafer W can be controlled to a desired level.

Further, in the prober 10, before the high-temperature medium and the low-temperature medium are mixed with each other, the flow rate of the high-temperature medium is controlled by the high-temperature medium dividing valve 37 and that of the low-temperature medium is controlled by the low-temperature medium dividing valve 38. Next, the temperature of the mixed medium is controlled by mixing the high-temperature medium and the low-temperature medium. Therefore, the temperature of the mixed medium can be easily controlled by controlling the flow rate of the high-temperature medium and the flow rate of the low-temperature medium.

Hereinafter, a substrate inspection apparatus and a substrate temperature control method according to a second embodiment will be described. A configuration or an operation of the second embodiment is basically the same as that of the first embodiment except that the mixed medium circulates through a circulation channel including the temperature control channel 28 without returning to the high-temperature chiller 26 or the low-temperature chiller 27. Therefore, description on redundant configuration and operation will be omitted and only the differences will be described.

Figure 5:
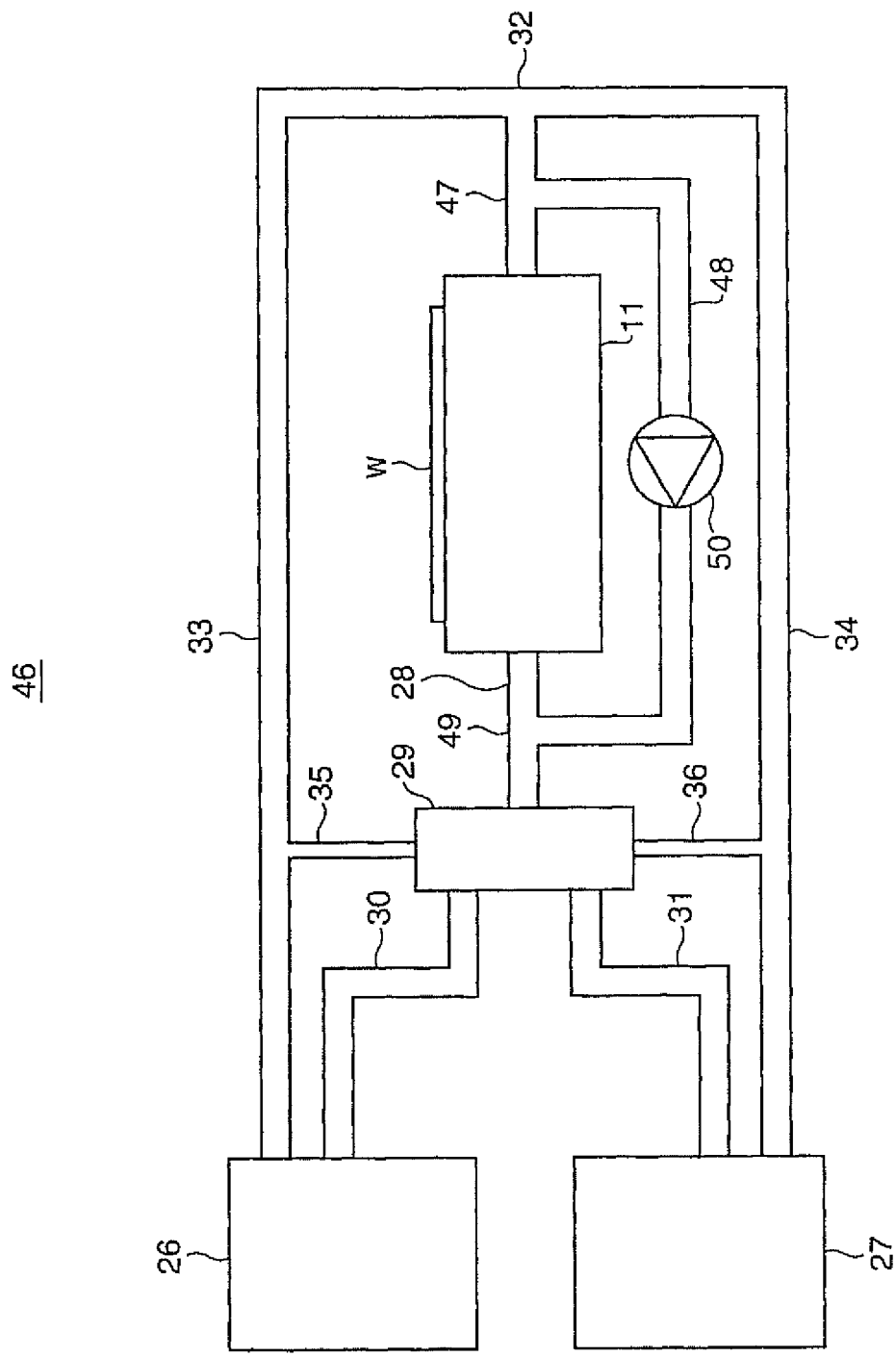
FIG. 5 is a block diagram showing a schematic configuration of a temperature control system of a prober of a substrate inspection apparatus according to a second embodiment.
Figure 6:
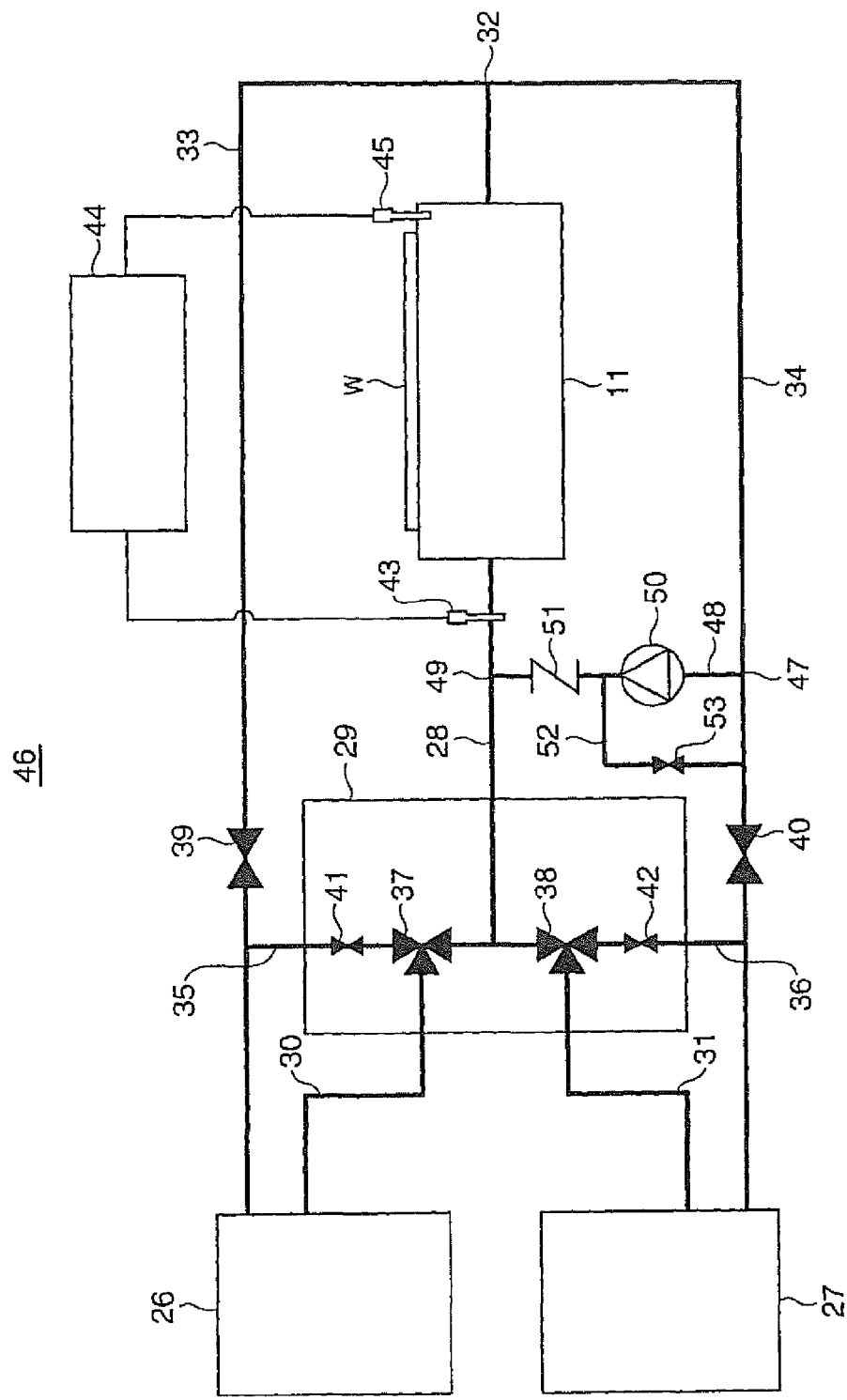
FIG. 6 is a piping diagram showing arrangement of valves in the temperature control system shown in FIG. 5.

FIG. 5 is a block diagram showing a schematic configuration of the temperature control system 46 of the prober 10 as the substrate inspection apparatus of the present embodiment. FIG. 6 is a piping diagram showing arrangement of valves in the temperature control system 46 shown in FIG. 5.

As shown in FIG. 5, in the temperature control system 46, the temperature control channel 28 is branched to a circulation channel 48 at a second branch point 47 disposed at a downstream side of the temperature control channel 28 passing through the stage 11. The circulation channel 48 is connected to the temperature control channel 28 at a junction 49 disposed between the mixing valve unit 29 and the stage 11. A force feed pump 50 is disposed in the circulation channel 48. The force feed pump 50 forcibly transfers the mixed medium from the second branch point 47 toward the junction 49. The operation of the force feed pump 50 is controlled by the controller 44.

As shown in FIG. 6, in the circulation channel 48, a check valve 51 is disposed between the junction 49 and the force feed pump 50. Accordingly, the backflow of the mixed medium in the circulation channel 48 is prevented. The circulation channel 48 has a branch line 52 that branches between the check valve 51 and the force feed pump 50 and joins with the second return channel 34 at a further downstream side than the second branch point 47. When a pressure of the mixed medium in the circulation channel 48 is abruptly increased, for example, the branch line 52 returns a portion of the mixed medium to the second return channel 34 in order to control the pressure in the circulation channel 48. In addition, a control valve 52 is disposed in the branch line 52.

In the temperature control system 46, a circulation flow channel is formed by the circulation channel 48 and a portion of the temperature control channel 28 formed between the junction 49 and the second branch point 47. The mixed medium is forcibly transferred by the force feed pump 50 and made to circulate through the circulation channel. Therefore, the flow rate of the mixed medium flowing through the temperature control channel 28 passing through the stage 11 can be increased. Further, when the heat is exchanged between the mixed medium and the wafer W via the stage 11, it is possible to prevent abrupt changes in the temperature of the mixed medium. As a result, the uniformity of the temperature of the stage 11 can be ensured.

In the temperature control system 46, a large amount of heat can be absorbed by circulating the mixed medium through the circulation channel. Therefore, the temperature control system 46 is suitable for inspection of electrical characteristics of a power device that generates a large amount of heat or for batch inspection of electrical characteristics of a plurality of memories.

In the temperature control system 46, the circulation channel 48 is closer to the stage 11 compared to the high-temperature chiller 26 or the low-temperature chiller 27. Therefore, a pressure loss in the circulation channel 48 is smaller when a flow rate of the mixed medium flowing through the temperature control channel 28 is increased by the force feed pump 50 than when a flow rate of the mixed medium is increased by the high-temperature chiller 26 or the low-temperature chiller 27. Accordingly, the flow rate of the mixed medium can be effectively increased.

In the temperature control system 46, when the temperature of the wafer W becomes close to the temperature of the mixed medium flowing through the temperature control channel 28 and thus becomes stable, inflow of a new high-temperature medium or a new low-temperature medium into the temperature control channel 28 may be stopped by closing the first mixed medium control valve 39 and the second mixed medium control valve 40 and also controlling the operation of the high-temperature medium dividing valve 37 or the low-temperature medium dividing valve 38. In that case, the mixed medium circulates only through the circulation flow channel. Since the circulating mixed medium absorbs heat from the wafer W or supplies heat to the wafer W, the temperature variation of the wafer W, if exists, can be decreased. Further, the mixed medium does not return to the high-temperature chiller 26 or the low-temperature chiller 27 via the first return channel 33 or the second return channel 34, the temperature of the high-temperature medium in the high-temperature chiller 26 or that of the low-temperature medium in the low-temperature chiller 27 can be easily maintained.

The force feed pump 50 or the circulation channel 48 may be installed in the stage 11 or may be installed outside the main body 12. The second branch point 47 may be disposed at an upstream side of the first branch point 32 as shown in FIG. 5 or may be disposed at a downstream side of the first branch point 32 as shown in FIG. 6.

Next, the structure of the stage 11 of the prober 10 as the substrate inspection apparatus of the above embodiment, to which the temperature control systems 25 and 46 are applied will be described. Hereinafter, two stages 11A and 11B will be described as examples of the stage 11 will be described with reference to FIGS. 7A, 7B and 8.

Figure 7A:
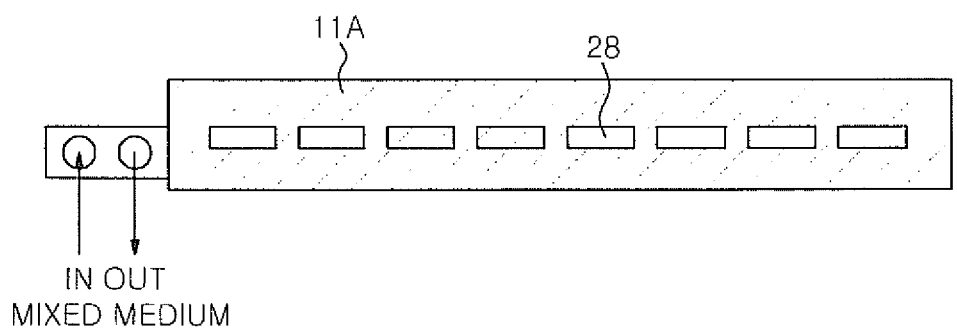
FIG. 7A is a cross sectional view showing a schematic structure of a first example of the stage of the prober shown in FIG. 1.
Figure 7B:
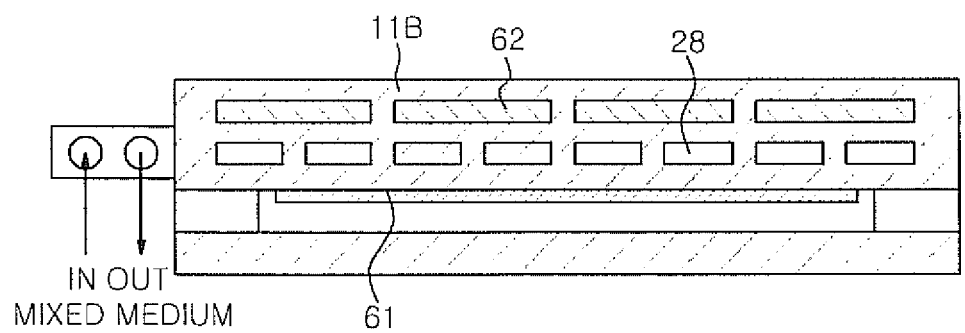
FIG. 7B is a cross sectional view showing a schematic structure of a second example of the stage of the prober shown in FIG. 1.

FIG. 7A is a cross sectional view showing a schematic structure of the stage 11A that is a first example of the stage 11. FIG. 7B is a cross sectional view showing a schematic structure of the stage 11B that is a second example of the stage 11.

As described above, the temperature control systems 25 and 46 control the temperature of the stage 11 by using the mixed medium flowing through the temperature control channel 28 passing through the stage 11. Therefore, the stage 11 does not require another heating unit and/or another cooling unit for controlling the temperature of the stage 11. Accordingly, the stage 11A shown in FIG. 7A has a simple structure in which the temperature control channel 28 is formed inside the stage 11A and another heating unit and another cooling unit are not provided with.

When the prober 10 includes the stage 11A, the temperature control range of the stage 11A depends on physical properties of a medium used as the high-temperature medium and the low-temperature medium. Therefore, when the temperature control range needs to be changed or extended, it is required to change the medium or the like. In order to extend the temperature control range of the temperature control systems 25 and 46, the stage 11B shown in FIG. 7B has a structure in which a cooling unit and a heating unit included in the temperature control systems 25 and 46 are added into the stage 11A.

As shown in FIG. 7B, the stage 11B includes the heater 61 as a heating unit and peltier elements (thermoelectric elements) 62 as both a heating and cooling unit. By operating the heater 61, the temperature control range of the stage 11B can be extended toward a high-temperature side. In the same manner, in the case of using the peltier elements 62 as a heating device, the temperature control range of the stage 11B can be extended to a high-temperature side. In the case of using the peltier elements 62 as a cooling device by reversing the polarity of the current flowing through the peltier elements 62, the temperature control range of the stage 11B can be extended to the low-temperature side. The operations of the heater 61 and the peltier elements 62 are controlled by the controller 44.

Figure 8:
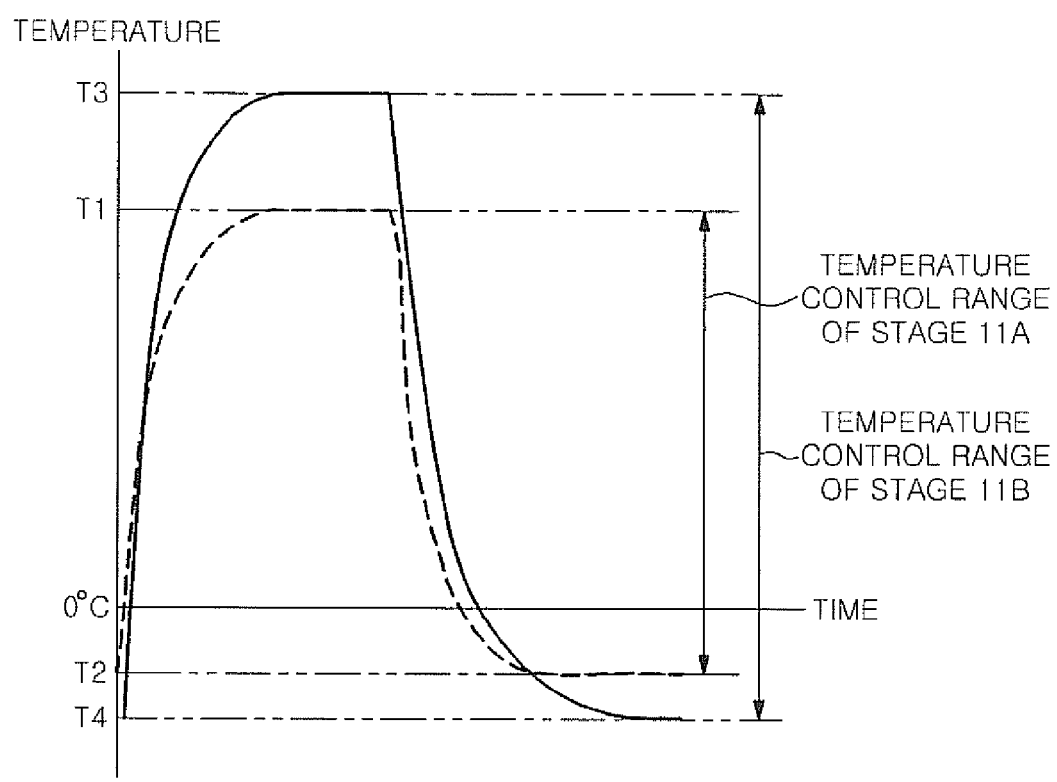
FIG. 8 shows schematic comparison between temperature control ranges of the two stages shown in FIGS. 7A and 7B.
Figure 9:
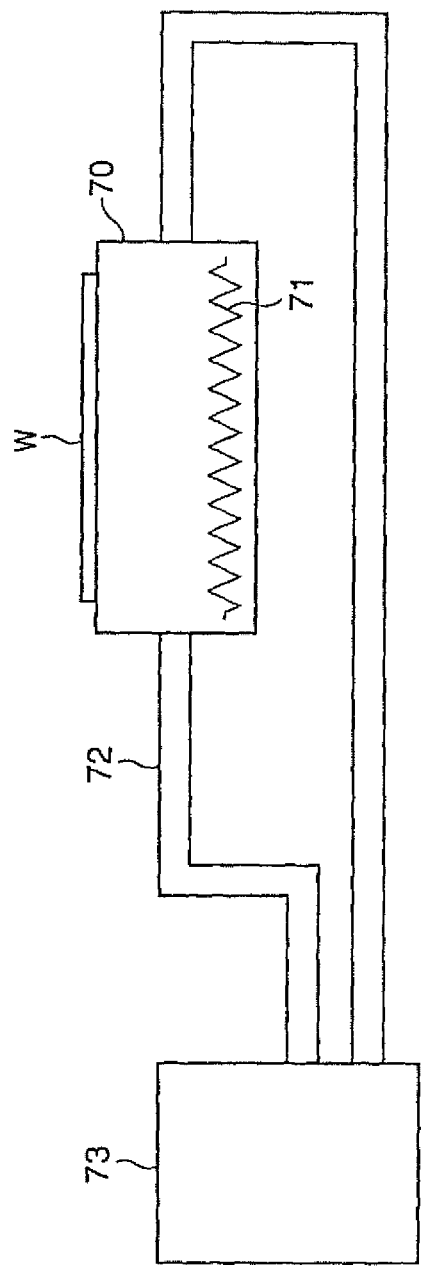
FIG. 9 is a block diagram showing a schematic configuration of a temperature control system of a conventional prober.

FIG. 8 schematically shows comparison between the temperature control ranges of the stages 11A and 11B. The other conditions except the structure of the stages 11A and 11B are the same. In the stage 11A, the temperature can be controlled within a range from T1 to T2 (e.g., T1=110° C., T2=−30° C.) by using a predetermined medium. On the other hand, in the stage 11B, a maximum temperature of the temperature control range can increased from T1 to T3 (T3>T1, e.g., T3=150° C.) by using the same medium and further heating the heater 61 and/or operating the peltier elements 62 as heating device. Further, in the stage 11B, a minimum temperature of the temperature control range can be increased from T2 to T4 (T4<T2, e.g., T4=−40° C.) by using the same medium and operating the peltier elements 62 as a cooling device. In the case of using the stage 11B, the temperature control range can be extended with a simple structure, compared to the case of using the stage 11A. The temperatures T1 to T4 are examples and do not restrict the disclosure.

In the case of controlling the temperature within the temperature control range of the stage 11B, the temperature can be increased at a higher speed, compared to the case of using only the mixed medium, because the heater 61 operates and/or the peltier elements 62 operate as a heating device. Further, the temperature can be decreased at a higher speed, compared to the case of using only the mixed medium, because the peltier elements 62 operate as a cooling element.

In the case of using the stage 11B, the temperature of the stage 11B may be set to a level higher than a boiling point of the medium used as the high-temperature medium and the low-temperature medium. In that case, the medium in the temperature control channels 28 passing through the stage 11B boils and steam is generated, which may result in decrease of the thermal conductivity from the medium to the stage 11B. Since, however, the stage 11B is made of a material having high thermal conductivity such as copper or the like, even if the medium boils, the temperature distribution (non-uniformity of the temperature) that disturbs the inspection of the wafer W does not occur on the surface of the stage 11B.

In the stage 11B, the peltier elements 62 are provided above the temperature control channels 28 as shown in FIG. 7B. However, the peltier elements 62 may be provided between the temperature control channels 28, for example. In addition, as for a modification of the stage 11B, only the peltier elements 62 may be provided without the heater 61. In that case as well, the temperature control range can be extended toward the high-temperature side and the low-temperature side. As for another modification of the stage 11B, only the heater 61 may be provided without the peltier elements 62. In that case, the temperature control range can be extended toward the high-temperature side.

While the disclosure has been shown and described with respect to the embodiments, the disclosure is not limited to the embodiments. In the temperature control system 25 or 46, pure water, Galden or Fluorinert was used as the high-temperature medium. However, when a medium having a temperature higher than the boiling point of pure water or the like is required, the boiling point of such a medium may be increased by applying a pressure to all channels such as the high-temperature medium supply line 30, the low-temperature medium supply line 31, and the like.

This application claims priority to Japanese Patent Application No. 2013-062141 filed on Mar. 25, 2013 and Japanese Patent Application No. 2013-201289 filed on Sep. 27, 2013, the entire contents of which are incorporated herein by reference.

DESCRIPTION OF REFERENCE NUMERALS

W: wafer
10: prober
11: stage
14: test head
25, 46: temperature control system
26: high-temperature chiller
27: low-temperature chiller
28: temperature control channel
29: mixing valve unit
47: second branch point
48: circulation channel
49: junction
50: force feed pump
61: heater
62: peltier element

What is claimed is:

1. A substrate inspection apparatus comprising:
a mounting table configured to mount thereon a substrate on which a semiconductor device is formed;
an inspection unit configured to inspect electrical characteristics of the semiconductor device on the mounted substrate;
a temperature control unit configured to control a temperature of the mounting table; and
a medium channel passing through the mounting table,
wherein the temperature control unit includes:
a high-temperature medium supply unit configured to supply a high-temperature medium;
a low-temperature medium supply unit configured to supply a low-temperature medium; and
a medium mixing unit,
wherein the substrate inspection apparatus further comprises:
a first return channel coupling a branch point disposed at a downstream side of the medium channel to the high-temperature medium supply unit;
a second return channel coupling the branch point to the low-temperature medium supply unit;
a high-temperature medium return channel coupling the medium mixing unit to the first return channel while bypassing the mounting table; and
a low-temperature medium return channel coupling the medium mixing unit to the second return channel while bypassing the mounting table,
wherein the medium mixing unit is configured to allow the high-temperature medium supplied from the high-temperature medium supply unit to be divided into the medium channel and the high-temperature medium return channel and the low-temperature medium supplied from the low-temperature medium supply unit to be divided into the medium channel and the low-temperature medium return channel, and
wherein the medium mixing unit is further configured to mix the high-temperature medium divided to the medium channel and the low-temperature medium divided to the medium channel.

2. The substrate inspection apparatus of claim 1, wherein the medium mixing unit includes:
a first control valve configured to control a flow rate of the high-temperature medium divided to the medium channel; and a second control valve configured to control a flow rate of the low-temperature medium divided to the medium channel, wherein, before the high-temperature medium divided to the medium channel and the low-temperature medium divided to the medium channel are mixed with each other, the first control valve controls the flow rate of the high-temperature medium divided to the medium channel and the second control valve controls the flow rate of the low-temperature medium divided to the medium channel.

3. The substrate inspection apparatus of claim 1, wherein the medium channel has an additional branch point branched to a circulation channel at a downstream side of the mounting table, wherein the circulation channel is coupled to the medium channel at a junction between the medium mixing unit and the mounting table, and the circulation channel has a pump configured to forcibly transferring the mixture of the high-temperature medium divided to the medium channel and the low-temperature medium divided to the medium channel from the additional branch point to the junction.

4. The substrate inspection apparatus of claim 1, wherein the substrate is a circular plate-shaped semiconductor wafer and has a diameter of 300 mm or above.

5. The substrate inspection apparatus of claim 1, wherein the high-temperature medium has a temperature ranging from 20° C. to 180° C. and the low-temperature medium has a temperature ranging from −100° C. to 60° C.

6. The substrate inspection apparatus of claim 1, further comprising a temperature sensor disposed in the medium channel between the medium mixing unit and the mounting table.

7. The substrate inspection apparatus of claim 1, further comprising a temperature sensor disposed at the mounting table.

8. The substrate inspection apparatus of claim 1, further comprising: one or both of a heater and a peltier element provided at the mounting table.

9. A substrate temperature control method in a substrate inspection apparatus, the substrate inspection apparatus comprising: a mounting table configured to mount thereon a substrate on which a semiconductor device is formed; an inspection unit configured to inspect electrical characteristics of the semiconductor device formed on the mounted substrate; a temperature control unit configured to control a temperature of the mounting table; and a medium channel passing through the mounting table, wherein the temperature control unit includes a high-temperature medium supply unit configured to supply a high-temperature medium, a low-temperature medium supply unit configured to supply a low-temperature medium and a medium mixing unit, the method comprising:

supplying the high-temperature medium and the low-temperature medium, wherein the substrate inspection apparatus further comprises:

a first return channel coupling a branch point disposed at a downstream side of the medium channel to the high-temperature medium supply unit, a second return channel coupling the branch point to the low-temperature medium supply unit, a high-temperature medium return channel coupling the medium mixing unit to the first return channel while bypassing the mounting table, and a low-temperature medium return channel coupling the medium mixing unit to the second return channel while bypassing the mounting table, and wherein the substrate temperature control method further comprises:

allowing the high-temperature medium supplied from the high-temperature medium supply unit to be divided into the medium channel and the high-temperature medium return channel and the low-temperature medium supplied from the low-temperature medium supply unit to be divided into the medium channel and the low-temperature medium return channel, and mixing the high-temperature medium divided to the medium channel and the low-temperature medium divided to the medium channel.

10. The substrate temperature control method of claim 9, further comprising, before said mixing the high-temperature medium divided to the medium channel and the low-temperature medium divided to the medium channel, controlling a flow rate of the high-temperature medium divided to the medium channel and a flow rate of the low-temperature medium divided to the medium channel.

11. The substrate temperature control method of claim 9, wherein the medium channel is branched to a circulation channel at an additional branch point at a downstream side of the mounting table, wherein the circulation channel is coupled to the medium channel at a junction at an upstream side of the mounting table, and wherein the method further comprising circulating the mixture of the high-temperature medium divided to the medium channel and the low-temperature medium divided to the medium channel through the medium channel between the junction and the branch point and through the circulation channel.

12. The substrate temperature control method of claim 9, wherein the temperature control unit further includes a heater provided at the mounting table, and wherein the method further comprising increasing a maximum temperature of a temperature control range of the mounting table by operating the heater.

13. The substrate temperature control method of claim 9, wherein the temperature control unit further includes a peltier element provided at the mounting table, and wherein the method further comprising increasing a maximum temperature of a temperature control range of the mounting table by operating the peltier element as a heating element and decreasing a minimum temperature of the temperature control range of the mounting table by operating the peltier element as a cooling element.

* * * * *